(12) United States Patent
Chen et al.

(10) Patent No.: US 8,741,403 B2
(45) Date of Patent: Jun. 3, 2014

(54) FLEXIBLE DISPOSITION APPARATUS

(75) Inventors: Shih-Hui Chen, Taoyuan Hsieh (TW); Chin-Tien Lin, Taoyuan Hsieh (TW)

(73) Assignee: Tennrich International Corp., Taoyuan Hsieh (TW)

( * ) Notice: Subject to any disclaimer, the term of this patent is extended or adjusted under 35 U.S.C. 154(b) by 588 days.

(21) Appl. No.: 12/727,878

(22) Filed: Mar. 19, 2010

(65) Prior Publication Data

US 2011/0229671 A1    Sep. 22, 2011

(51) Int. Cl.
*B32B 1/02*      (2006.01)
*B32B 3/06*      (2006.01)
*B65D 85/86*   (2006.01)

(52) U.S. Cl.
USPC ............. 428/34.1; 206/701; 206/722; 428/99

(58) Field of Classification Search
USPC ........... 428/34.1, 36.8, 99, 100; 206/701, 722
See application file for complete search history.

(56) References Cited

U.S. PATENT DOCUMENTS

| | | | |
|---|---|---|---|
| 4,569,382 A * | 2/1986 | Maxey et al. | 152/548 |
| 6,581,760 B1 * | 6/2003 | Robertson | 206/5 |
| 2003/0020629 A1 * | 1/2003 | Swartz et al. | 340/825.25 |
| 2004/0075032 A1 * | 4/2004 | Lutz | 248/206.3 |
| 2009/0106567 A1 * | 4/2009 | Baarman | 713/300 |

* cited by examiner

*Primary Examiner* — Erik Kashnikow
(74) *Attorney, Agent, or Firm* — Jackson IPG PLLC (57) ABSTRACT

A flexible disposition apparatus includes a body made of a flexible material and at least one attaching element integrally formed on at least one lateral surface of the body, and the body includes a containing portion and an opening interconnected to the containing portion, such that the containing portion and the attaching element can combine at least one electronic device with a power bank, or combine at least one expansion module with an electronic device to constitute an electric connection in order to reduce the carrying volume and enhance the practicality of the apparatus.

7 Claims, 11 Drawing Sheets

FLEXIBLE DISPOSITION APPARATUS

BACKGROUND OF THE INVENTION

1. Field of the Invention

The present invention relates to a flexible disposition apparatus, and more particularly to a convenient, portable, flexible disposition apparatus applied for charging electricity or expanding functions of an electronic product.

2. Description of the Related Art

Figure 1:
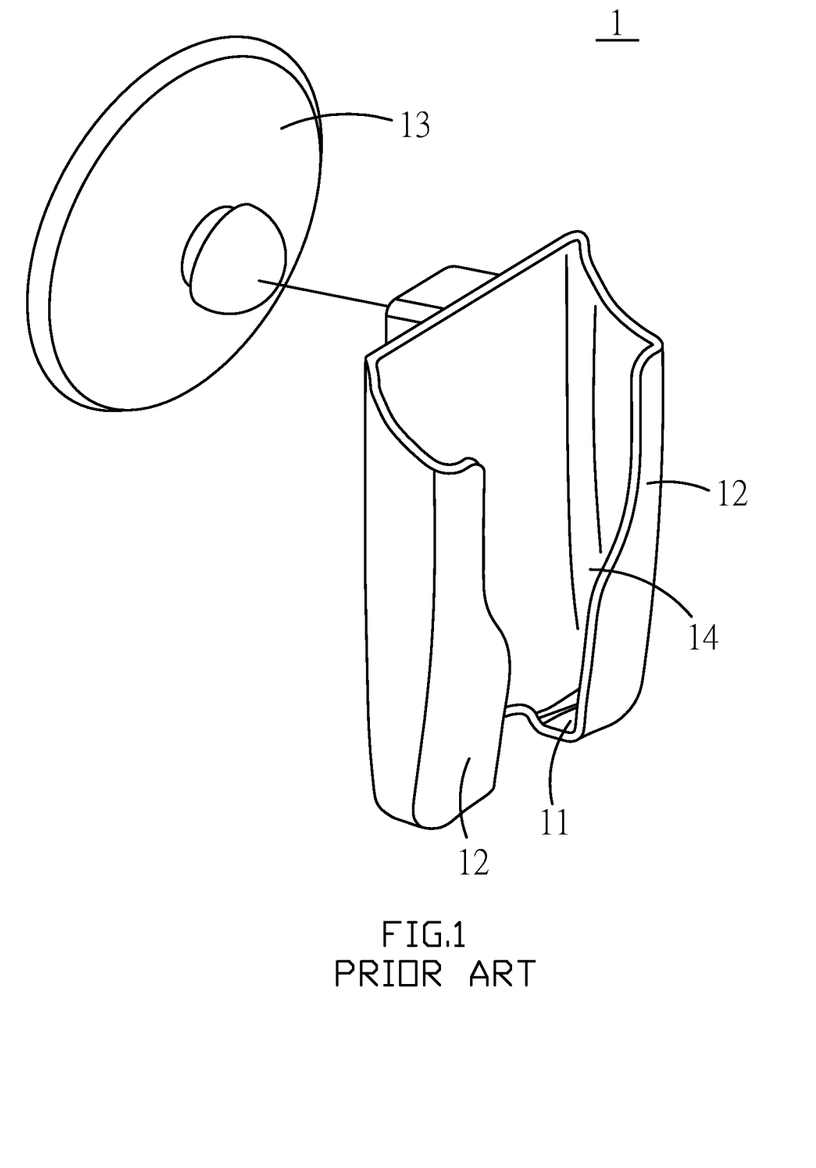
FIG. 1 is a schematic view of a conventional disposition base.

With reference to FIG. 1 for a wireless network card disposition base as disclosed in R.O.C. Pat. No. M360391, the wireless network card disposition base 1 comprises a support portion 11 formed at the bottom of the disposition base 1 for supporting a wireless network card, an opening 11 formed on a side of the support portion 11 for passing a transmission line, a stop portion 12 extended from both sides of the disposition base 1 separately, and an attaching element 13 installed on another surface of the disposition base 1, wherein the attaching element 13 is a suction disk.

If a user wants to use the disposition base 1 to dispose the wireless network card, the attaching element 13 is provided for the user to fix the disposition base 1 to a better signal receiving position freely to achieve the effect of fixing the wireless network card at a better signal receiving position conveniently.

However, the disposition base 1 and the attaching element 13 are formed separately first, and then assembled and fixed with each other, and thus the overall manufacturing process is relatively complicated. Furthermore, the attaching element 13 may fall off easily, and the disposition base is in a form of fixed shape and size, such that it can fit objects with a specific shape or size only. In addition, the disposition base 1 generally comes with a design including two stop portions 12 extended from both sides of the disposition base 1 respectively for fixing the wireless network card without affecting its signal transmission, and an open space defined between the two stop portions 12, such that the wireless network card is not covered completely. When the wireless network card disposition base is installed to another electronic product, the electronic product installed at the open space 14 of the disposition base may be affected by external electromagnetic interferences easily, so that the normal operation of the electronic product may be affected.

SUMMARY OF THE INVENTION

In view of the shortcomings of the conventional disposition apparatus, the inventor of the present invention based on years of experience in the related industry to conduct extensive researches and experiments, and finally developed a flexible disposition apparatus in accordance with the present invention to overcome the shortcomings of the prior art.

Therefore, it is a primary objective of the present invention to overcome the aforementioned shortcomings and deficiencies of the prior art by providing a convenient, portable, flexible disposition apparatus applied for charging electricity or expanding functions of an electronic product To achieve the foregoing objective, the present invention discloses a flexible disposition apparatus comprising a body made of a flexible material and at least one attaching element integrally formed on at least one lateral surface of the body, and the body comprises a containing portion and an opening interconnected to the containing portion, such that the containing portion and the attaching element can be used for combining and electrically coupling at least one electronic device with a power bank, or combining and electrically coupling at least one expansion module with an electronic device to reduce the carrying volume and enhance the practicality of the flexible disposition apparatus. In addition, the flexible material of the flexible disposition apparatus can be formed in any shape freely for installing various different objects and the material can be used for preventing electromagnetic interferences (EMI) and providing a heat dissipation effect.

DETAILED DESCRIPTION OF THE PREFERRED EMBODIMENTS

The technical characteristics of the present invention will become apparent with the detailed description of the preferred embodiments and the illustration of the related drawings.

Figure 2:
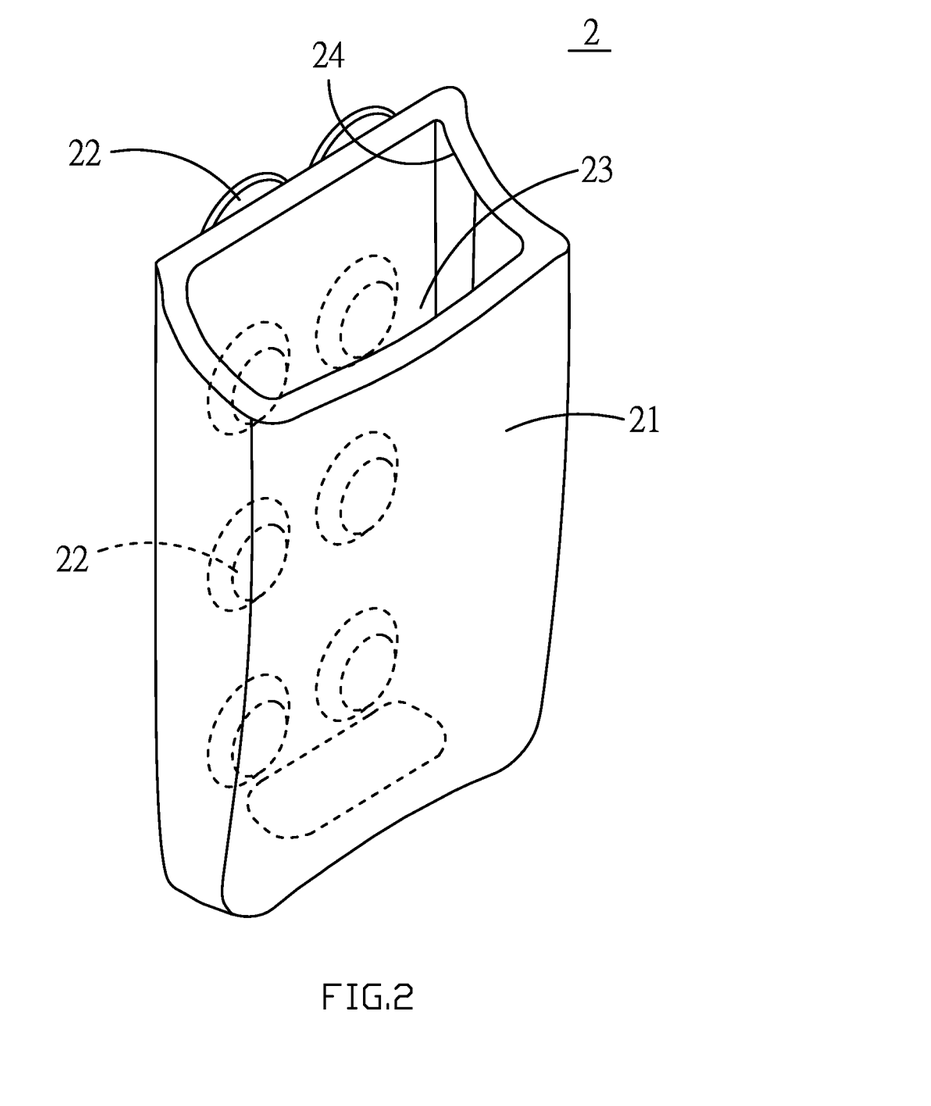
FIG. 2 is a schematic view of a structure of a flexible disposition apparatus in accordance with the present invention.

With reference to FIG. 2 for a flexible disposition apparatus of the present invention, the flexible disposition apparatus 2 comprises a body 21 made of a flexible material, wherein the flexible material is a rubber, polyurethane (PU) or thermoresponsive material, and at least one attaching element 22 integrally formed on at least one lateral surface of the body 21, wherein the attaching element 22 as shown in FIG. 2 is a suction disk formed on a lateral surface of the body 21, and the body 21 includes a containing portion 23 and an opening 24 interconnected to the containing portion 23.

The flexible disposition apparatus of the present invention can be used for charging an electronic device or expanding the functions of the electronic device, and the flexible disposition apparatus can combine at least one electronic device with a power bank, or combine at least one expansion module with an electronic device by the containing portion and the attaching element.

Figure 3:
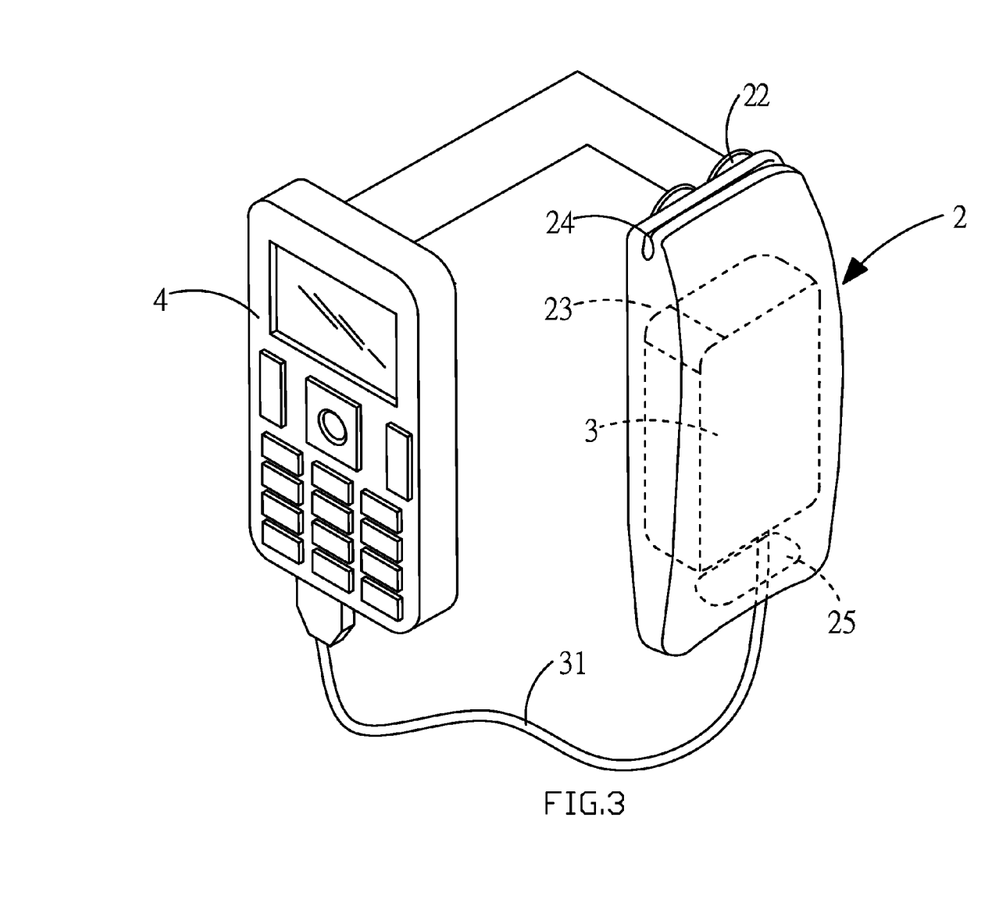
FIG. 3 is an exploded view of a using status of a flexible disposition apparatus in accordance with a first preferred embodiment of the present invention.
Figure 4:
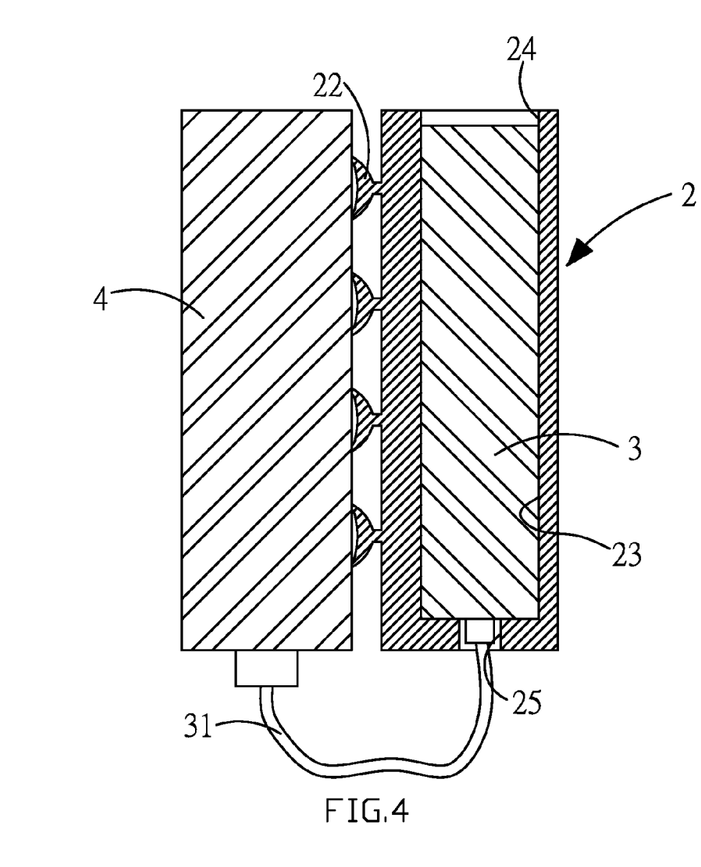
FIG. 4 is a schematic view of a using status of a flexible disposition apparatus in accordance with a first preferred embodiment of the present invention.

With reference to FIGS. 3 and 4 for a first preferred embodiment, the power bank 3 is installed in the containing portion 23, and the electronic device 4 is fixed onto the flexible disposition apparatus 2 by the attaching element 22. Since the body 21 is made of a flexible material, the opening 24 of the body 21 will be closed to cover and attach the power bank 3 closely after the power bank 3 is installed to the containing portion 23, and the flexible disposition apparatus 2 further comprises at least one through hole 25 interconnected to the bottom of the containing portion 23 for passing at least one transmission component 31, wherein the transmission component 31 constitutes an electric connection of the electronic device 4 and the power bank 3, such that the power bank 3 can charge the electronic device 4. Of course, the electronic device can also be installed in the containing portion, and the power bank can be attached and fixed onto the attaching element.

Figure 5:
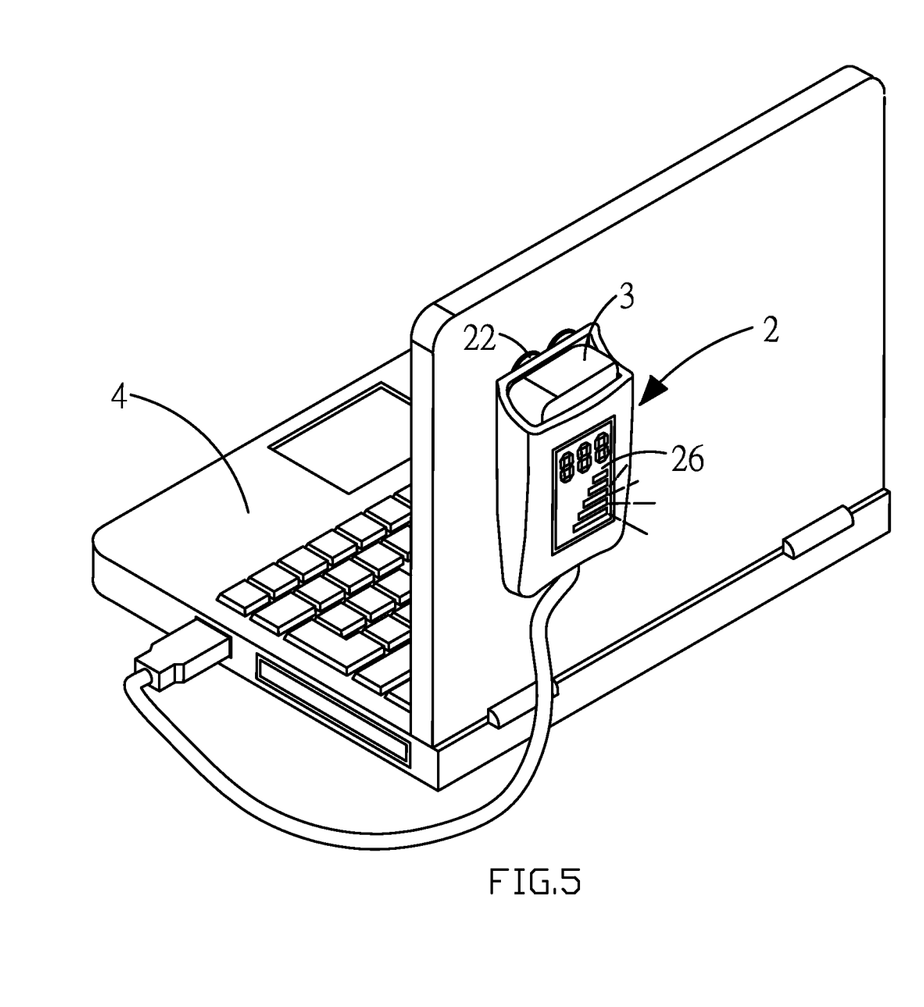
FIG. 5 is a perspective view of a using status of a flexible disposition apparatus in accordance with a second preferred embodiment of the present invention.

The electronic device 4 is a handheld electronic device such as a mobile phone or a personal digital assistant (PDA) as shown in FIG. 2, or the electronic device 4 is a notebook computer. With reference to FIG. 5 for a second preferred embodiment, the flexible disposition apparatus 2 further comprises a display module 26 installed on a surface without the attaching element 22 and electrically coupled to the power bank 3 for supplying electric power, and the display module 26 is provided for displaying the power level of the power bank 3. If the flexible material is a thermo-responsive material, then a detected temperature can be displayed by the display module 26.

Figure 6:
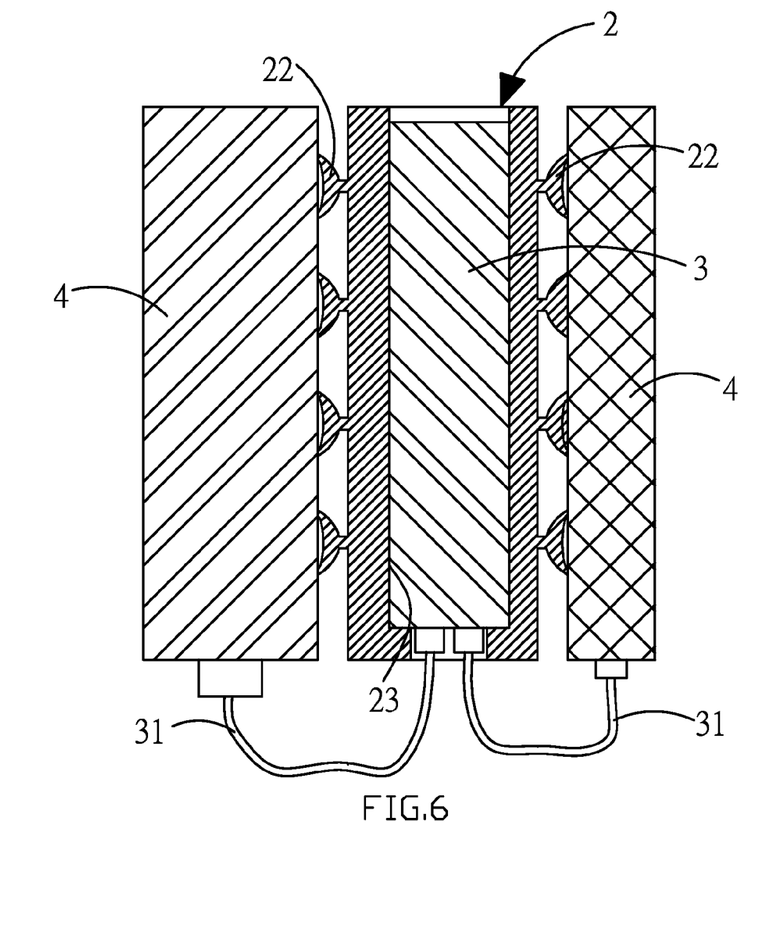
FIG. 6 is a schematic view of a using status of a flexible disposition apparatus in accordance with a third preferred embodiment of the present invention.

With reference to FIG. 6 for a third preferred embodiment, an attaching element 22 is formed on two opposite surfaces of the body 21 separately, such that if the flexible disposition apparatus is applied for charging an electronic device, the power bank 3 can be installed in the containing portion 23, and the aforementioned two electronic devices 4 can be fixed onto both lateral surfaces of the flexible disposition apparatus 2 by the attaching elements 22 respectively, so that one power bank 3 can charge two electronic device 4 at the same time.

Figure 7:
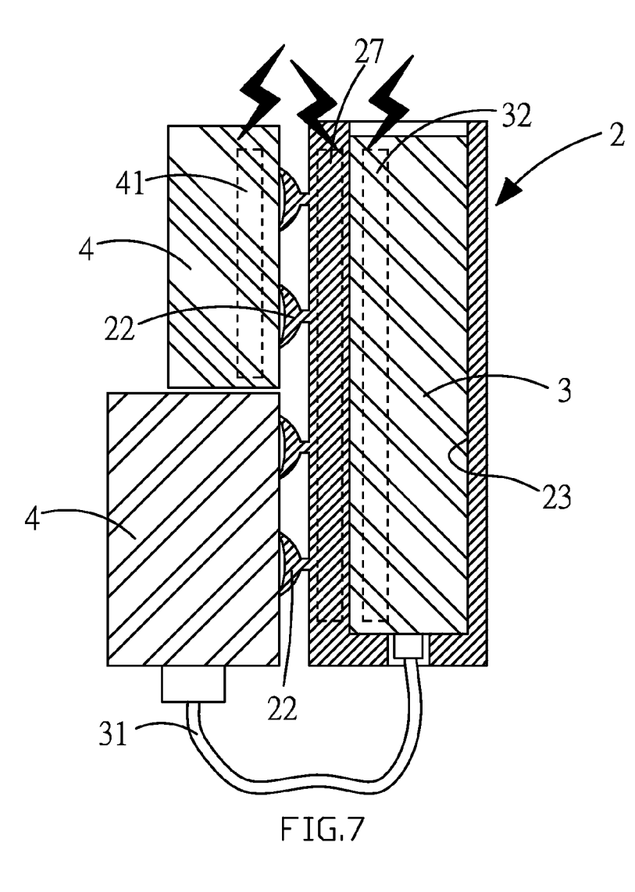
FIG. 7 is a schematic view of a using status of a flexible disposition apparatus in accordance with a fourth preferred embodiment of the present invention.

In addition, the attaching element can be used for attaching and fixing a plurality of objects. With reference to FIG. 7 for a fourth preferred embodiment, if the flexible disposition apparatus is applied for charging an electronic device, the power bank 3 can be installed in the containing portion 23, and the two electronic devices 4 and the power bank 3 can be fixed onto a lateral surface of the flexible disposition apparatus 2 by the attaching elements 22, and one of the electronic devices 4 and the flexible disposition apparatus 2 include first, second, and third coils 32, 41, 27 respectively, and each coil 32, 41, 27 constitutes a power transmission between the power bank 3 and the electronic device 4, and the electronic device 4 and the power bank 3 are electrically coupled by the transmission component 31, such that the electric power of the power bank 3 can be used for charging the electronic devices by a wireless or cable transmission. Of course, the power bank and the electronic device can include first and second coils respectively, wherein each coil constitutes a power transmission between the power bank and the electronic device.

Figure 8:
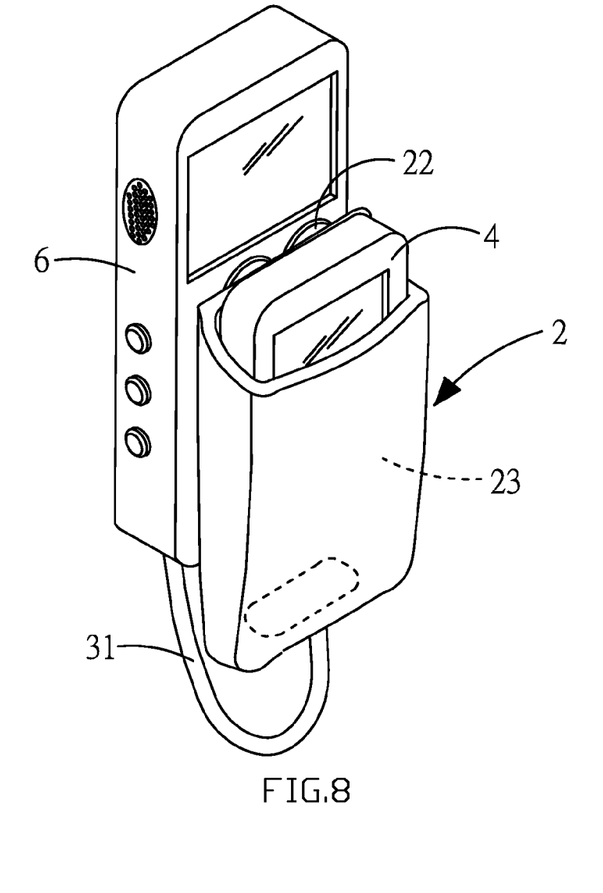
FIG. 8 is a perspective view of a using status of a flexible disposition apparatus in accordance with a fifth preferred embodiment of the present invention.

The flexible disposition apparatus in accordance with the aforementioned preferred embodiments can be applied for expanding the functions of an electronic device, and the flexible disposition apparatus can combine at least one expansion module with an electronic device by the containing portion and the attaching element in accordance with a fifth preferred embodiment as shown in FIG. 8, wherein the electronic device 4 is installed in the containing portion 23, and the expansion module 6 is fixed onto the flexible disposition apparatus 2 by the attaching element 22, and the electronic device 4 can be a mobile phone, a translation machine, a personal computer, a notebook computer, a personal digital assistant (PDA), a portable GPS device, and a portable multimedia player, etc, and the expansion module 6 is inserted into an electronic device 4 to constitute an electric connection through a transmission component 31, such that the electronic device 4 can provide the functions of the expansion module 6 such as a GPS function, a video recording function, a digital video playing function, a wireless communication function, and a signal broadcasting function, in addition to its own functions.

Figure 9:
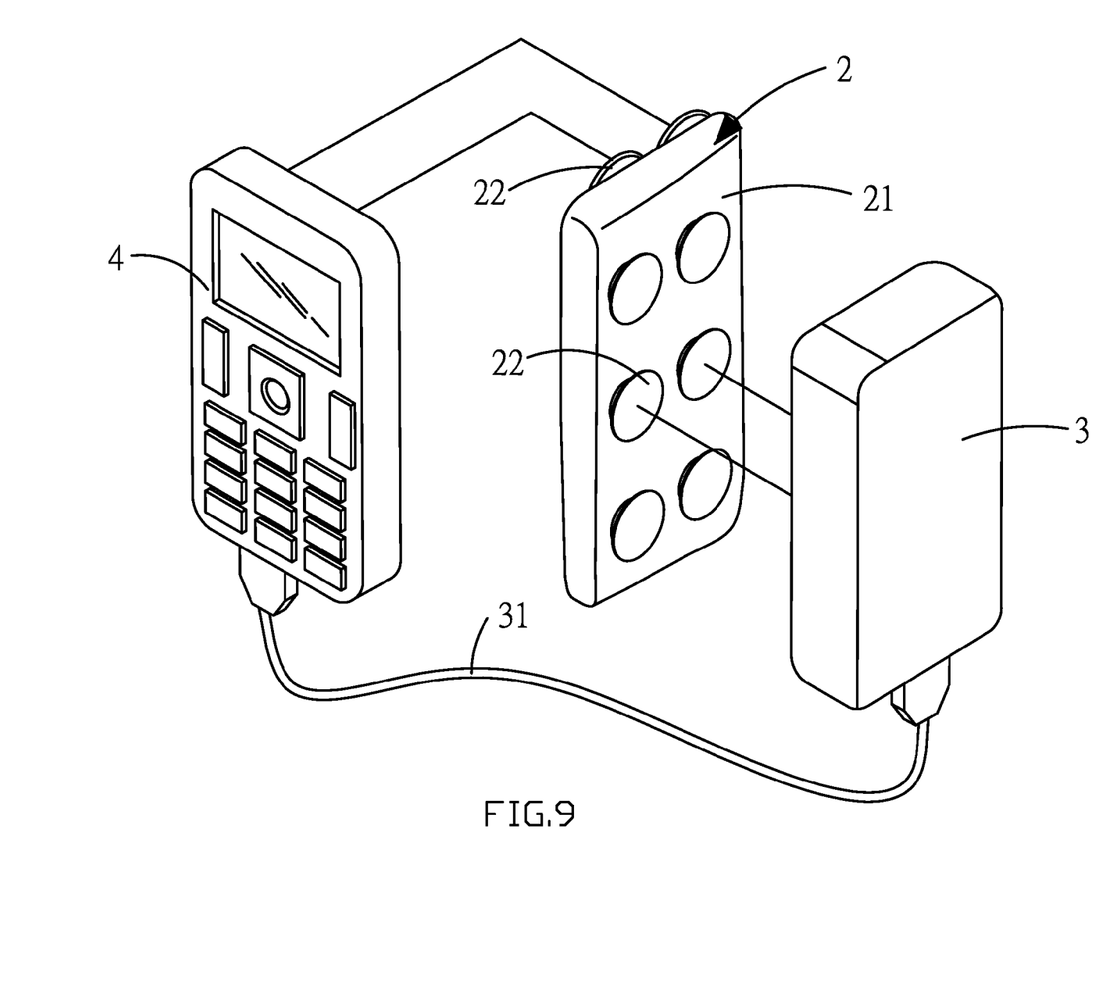
FIG. 9 is a perspective view of a structure of a flexible disposition apparatus in accordance with another preferred embodiment of the present invention.
Figure 10:
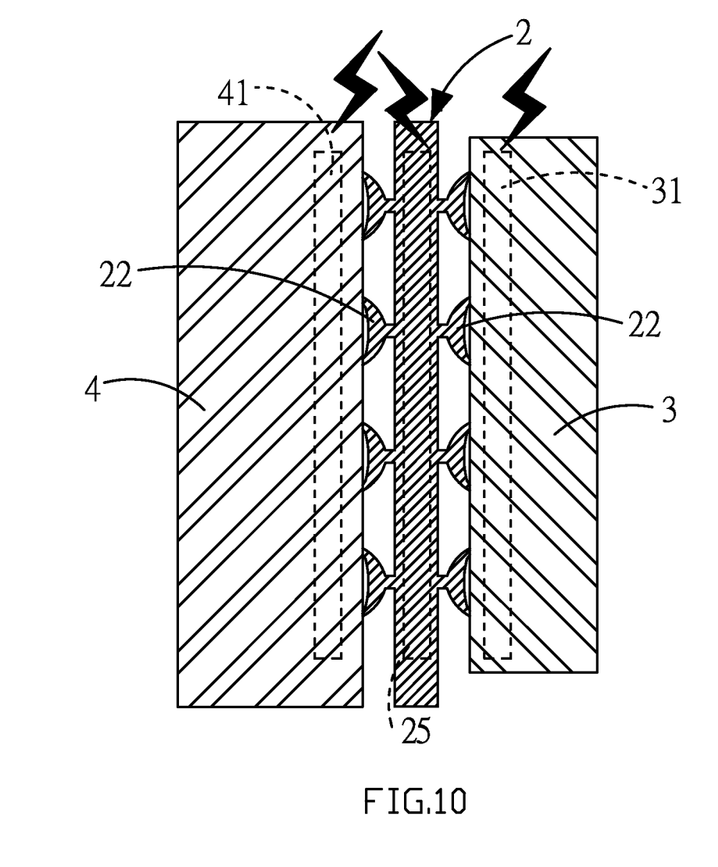
FIG. 10 is a schematic view of a using status of a flexible disposition apparatus in accordance with a sixth preferred embodiment of the present invention.

With reference to FIG. 9 for another preferred embodiment of the flexible disposition apparatus, the apparatus comprises a body 21 made of a flexible material and at least one attaching element 22 integrally formed on at least one lateral surface of the body 21. In FIG. 9, an attaching element 22 is integrally and separately formed on two opposite surfaces of the body 21, and a transmission component 31 is provided for forming a power transmission between a power bank 3 and an electronic device 4. Alternatively, each coil 27, 32, 41 constitutes a power transmission between the power bank 3 and the electronic device 4 in accordance with a sixth preferred embodiment as shown in FIG. 10. Both of the aforementioned embodiments can achieve the effect of expanding the functions of the electronic device.

Figure 11:
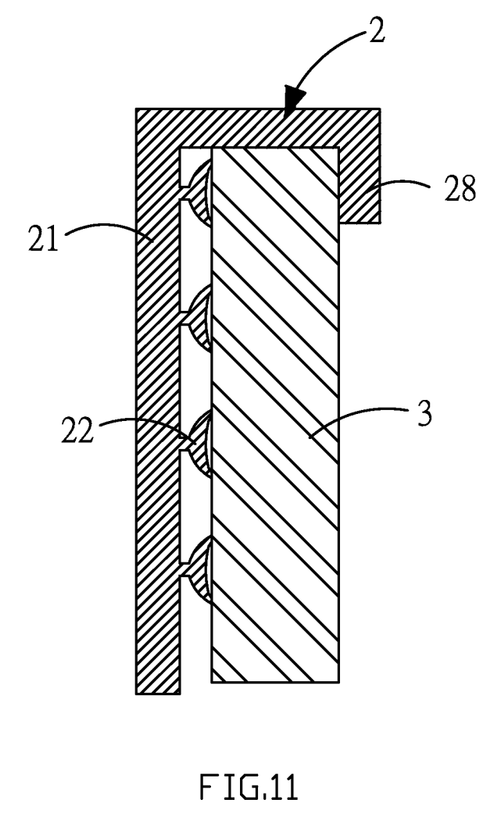
FIG. 11 is a schematic view of a structure of a flexible disposition apparatus in accordance with a further preferred embodiment of the present invention.

In addition, the body 21 comprises an attaching element 22 integrally formed on a lateral surface of the body 21 in accordance with a further preferred embodiment as shown in FIG. 11, and a hook 28 integrally formed at the top of the lateral surface, such that the attaching element 22 and the hook 28 can be used for fixing the power bank 3 to facilitate its charging other electronic devices.

It is noteworthy to point out that the body and the attaching element of the flexible disposition apparatus in accordance with the present invention are integrally formed, such that the overall manufacturing procedure can be simplified, and the flexible material can be set in any shape for installing various different objects, and the invention can be used for charging electricity or expanding functions of an electronic product, so as to reduce the carrying volume and enhance the practicality. Further, the flexible material can be doped with a metal filament to achieve the effect of preventing electromagnetic interferences (EMI) and providing a heat dissipation effect.

The present invention improves over the prior art and complies with patent application requirements, and thus is duly filed for the patent application. While the invention has been described by device of specific embodiments, numerous modifications and variations could be made thereto by those generally skilled in the art without departing from the scope and spirit of the invention set forth in the claims.

What is claimed is:

1. A flexible disposition apparatus, comprising a body made of a thermo-responsive flexible material and at least one attaching element integrally formed on at least one lateral surface of the body, and the body comprising a containing portion and an opening interconnected to the containing portion, wherein the attaching element is a suction disk for attaching the body to an external device; and wherein the containing portion of the flexible disposition apparatus is provided for accommodating a power bank, and further comprising a display module installed on a surface of the body different from the surface on which the at least one attaching element is disposed, and wherein the display module is electrically connected to the power bank and displays a power level of the power bank and a detected temperature, wherein the flexible disposition apparatus combines at least one electronic device with the power bank by the containing portion and the attaching element.

2. The flexible disposition apparatus of claim 1, further comprising at least one through hole interconnected to the containing portion and provided for passing at least one transmission component, wherein the transmission component is provided for electrically coupling the electronic device and the power bank.

3. The flexible disposition apparatus of claim 1, wherein the power bank, the electronic device and the flexible disposition apparatus include first, second and third coils respectively, and each coil constitutes an electric transmission between the power bank and the electronic device.

4. The flexible disposition apparatus of claim 1, wherein the power bank and the electronic device include first and second coils respectively, and each coil constitutes an electric transmission between the power bank and the electronic device.

5. A flexible disposition apparatus, comprising a body made of a thermo-responsive flexible material and at least one attaching element integrally formed on at least one lateral surface of the body, and the body comprising a containing portion and an opening interconnected to the containing portion, wherein the attaching element is a suction disk for attaching the body to an external device; and wherein the containing portion of the flexible disposition apparatus is provided for accommodating a power bank, and further comprising a display module installed on a surface of the body different from the surface on which the at least one attaching element is disposed, and wherein the display module is electrically connected to the power bank and displays a power level of the power bank and a detected temperature, wherein the flexible material is doped with a metal filament.

6. A flexible disposition apparatus, comprising a body made of a thermo-responsive flexible material and at least one attaching element integrally formed on at least one lateral surface of the body, and the body comprising a containing portion and an opening interconnected to the containing portion, wherein the attaching element is a suction disk for attaching the body to an external device; and wherein the containing portion of the flexible disposition apparatus is provided for accommodating a power bank, and further comprising a display module installed on a surface of the body different from the surface on which the at least one attaching element is disposed, and wherein the display module is electrically connected to the power bank and displays a power level of the power bank and a detected temperature, wherein the flexible disposition apparatus combines at least one expansion module with an electronic device by the containing portion and the attaching element.

7. The flexible disposition apparatus of claim 6, further comprising at least one through hole interconnected to the containing portion and provided for passing at least one transmission component, wherein the transmission component is provided for electrically coupling the electronic device and the power bank.

* * * * *